United States Patent
Proell et al.

(10) Patent No.: US 7,120,074 B2
(45) Date of Patent: Oct. 10, 2006

(54) SEMICONDUCTOR MEMORY AND METHOD FOR OPERATING A SEMICONDUCTOR MEMORY

(75) Inventors: Manfred Proell, Dorfen (DE); Herbert Benzinger, Munich (DE); Manfred Dobler, Munich (DE); Joerg Kliewer, Munich (DE)

(73) Assignee: Infineon Technologies AG, Munich (DE)

( * ) Notice: Subject to any disclaimer, the term of this patent is extended or adjusted under 35 U.S.C. 154(b) by 135 days.

(21) Appl. No.: 10/911,230

(22) Filed: Aug. 4, 2004

(65) Prior Publication Data
US 2005/0057982 A1    Mar. 17, 2005

(30) Foreign Application Priority Data
Aug. 4, 2003 (DE) ................ 103 35 618

(51) Int. Cl.
*G11C 7/04* (2006.01)
(52) U.S. Cl. ............ 365/212; 365/189.09; 365/189.11; 365/211
(58) Field of Classification Search ............ None
See application file for complete search history.

(56) References Cited

U.S. PATENT DOCUMENTS

| | | | | |
|---|---|---|---|---|
| 5,198,995 A | * | 3/1993 | Dennard et al. | 365/149 |
| 5,606,265 A | * | 2/1997 | Sakata et al. | 326/34 |
| 5,650,976 A | * | 7/1997 | McLaury | 365/230.06 |
| 6,002,627 A | | 12/1999 | Chevallier | |
| 6,016,281 A | | 1/2000 | Brox | |
| 6,205,074 B1 | * | 3/2001 | Van Buskirk et al. | 365/211 |
| 6,496,422 B1 | * | 12/2002 | Marr | 365/189.09 |
| 6,950,358 B1 | * | 9/2005 | Lindstedt | 365/201 |
| 2002/0105845 A1 | * | 8/2002 | Hidaka | 365/222 |
| 2005/0104566 A1 | * | 5/2005 | Kim | 323/226 |

* cited by examiner

*Primary Examiner*—Son Mai
(74) *Attorney, Agent, or Firm*—Slater & Matsil, L.L.P.

(57) ABSTRACT

A semiconductor memory includes storage cells (2) that have storage capacitors and transistors with an electrode, which is electrically biasable with two different electrical potentials (V1, V2) in order to open and close the transistor. The electrode potential (V2) intended for the off state of the transistor is a temperature-dependent potential, the value of which is controlled temperature-dependently by the semiconductor memory (1) so that the second electrical potential (V2) becomes more different from the first electrical potential (V1) as the temperature (T) increases.

25 Claims, 4 Drawing Sheets

FIG 7

$$I_{DS} = \beta_n \cdot n \cdot \left(\frac{k \cdot T}{q}\right)^2 \cdot e^{\frac{q}{n \cdot k \cdot T} \cdot \left(U_{GS} - U_{TN} - \frac{n \cdot k \cdot T}{q}\right)} \cdot \left[1 - e^{-\frac{q}{k \cdot T} \cdot U_{DS}}\right]$$

FIG 8

$$U_{GS} \leq U_{TN} + \frac{n \cdot k \cdot T}{q}$$

FIG 9

$$\frac{t_{T1}}{t_{T2}} = e^{-\left(\frac{\ln 2}{18\,°C} \cdot (T1 - T2)\right)}$$

SEMICONDUCTOR MEMORY AND METHOD FOR OPERATING A SEMICONDUCTOR MEMORY

This application claims priority to German Patent Application 103 35 618.5, which was filed Aug. 4, 2003 and is incorporated herein by reference.

TECHNICAL FIELD

The invention relates to a semiconductor memory with a multiplicity of storage cells. The invention also relates to a method for operating a semiconductor memory.

BACKGROUND

Dynamic semiconductor memories have storage cells in which charges are stored in storage capacitors, which can be driven by selection transistors. For the selection transistor, modern semiconductor memories, for example DRAMs (Dynamic Random Access Memory), mostly use field-effect transistors in whose channel region a channel is formed or suppressed as a function of the voltages applied to the source, gate and drain electrodes. In the case of an enhancement-type transistor, the application of a wordline voltage higher than the threshold voltage of the transistor leads to the formation of a channel, and therefore to a conductive connection between the drain electrode and the source electrode, so that information stored in the storage capacitor can be read or information can be written to the storage capacitor. In the off state, the selection transistor prevents the information stored in the storage capacitor from flowing away through the bitline. During the time when the stored information is not being interrogated, it should be kept unchanged as far as possible.

In dynamic semiconductor memories, however, the quantities of charge stored in the storage capacitors become depleted after only a short time. Leakage currents are responsible for this. Dynamic semiconductor memories are therefore refreshed at short time intervals ("refresh time"). For example, the charge of each storage capacitor of the semiconductor memory is replenished at an interval of 64 milliseconds. That is to say, it is first read in an only slightly discharged state and then rewritten more strongly. Owing to this overwriting of the quantity of charge of all the storage capacitors periodically over time, the stored quantity of charge at any time is always greater than the minimum charge that is necessary in order to unequivocally determine whether the residual charge still stored represents a digital "1" or a digital "0".

When the transistor is off (in the case of an enhancement-type transistor, when the transistor channel is not formed) leakage currents nevertheless flow and discharge the storage capacitor, which is actually to be blocked. In the subliminal current range, the transistor is in a state of weak inversion and a small residual current flows between the source electrode and the drain electrode. This current decreases exponentially as the gate potential becomes more different from the threshold voltage, for which reason negative wordline potentials in the off state are applied in the case of n-channel transistors in modern semiconductor memories, in order to reduce this leakage current. Another leakage-current mechanism is direct interband tunnelling in the vicinity of the space-charge zones between the drain electrode on the capacitor side and the semiconductor substrate. This effect is also affected by the wordline potential ("GIDL effect"; Gate Induced Drain Leakage).

The negative wordline voltage applied in the case n-channel transistors is intended to prevent the occurrence of significant leakage currents. The dimensions and geometries of microelectronic structures are furthermore optimized via the production technology with a view to minimal leakage currents, but on the other hand it is necessary to ensure sufficiently fast charging and discharging of the storage capacitor via the transistor when it is open.

SUMMARY OF THE INVENTION

In one aspect, the invention achieves even better protection of a semiconductor storage cell against leakage-current mechanisms, beyond these measures, and increases the reliability and durability of the storage in a semiconductor memory.

For example, a semiconductor memory includes a multiplicity of storage cells, each of which has a charge storage and a transistor with an electrode. The electrode is separated from a channel region of the transistor by a dielectric layer. The electrode is electrically biasable with a first electrical potential in order to open the transistor and with a second electrical potential in order to close the transistor. The semiconductor memory provides the first electrical potential and the second electrical potential. The second electrical potential provided by the semiconductor memory is a temperature-dependent potential, the value of which is controlled by the semiconductor memory in order to reduce leakage currents. The second electrical potential is controlled so that it becomes more different from the first electrical potential as the temperature increases.

According to the preferred embodiment of the invention, instead of a conventionally constant second potential that can no longer be changed during operation of the semiconductor memory, a variable potential is delivered as a second electrical potential to the electrode of the transistor, with the value depending on the instantaneous temperature of the semiconductor memory or its environment. As a function of this temperature, which is determined by a temperature sensor internal to the memory or an external temperature sensor, or is at least converted into a temperature-dependently regulated second electrical potential, an additional degree of freedom is introduced which takes the temperature dependencies of the leakage currents into account unlike the conventional measures. Whereas conventional memories provide a fixed potential value, the value of which has at best been determined by taking a set operating temperature into account, the potential control according to an embodiment of the invention allows optimization of wordline voltages with a view to minimal discharging of the storage capacitor. Therefore, leakage currents are reduced and retention times are increased at any actual operating temperature, which deviates from a setpoint operating temperature.

According to embodiments of the invention, the second electrical potential is controlled so that it becomes more different from the first electrical potential as the temperature increases. The first and second potentials correspond to the on and off states of the transistor. A difference between the fixed value of the first potential and the temperature-dependent value of the second potential, which becomes greater as the temperature increases, accommodates the tendency that leakage currents generally increase when the temperature is higher.

With respect to the order of magnitude of the modification of the second electrical potential, the potential is modified by from about 0.5 to 5.0 mV/° C., preferably by from about 1.5 to 2.5 mV/° C. The respective change in the second potential as a function of the temperature is adjusted by a control circuit or regulating circuit structurally embodied in the semiconductor memory.

Preferably, the second electrical potential depends linearly on the temperature. This embodiment has the advantage that a linear subcircuit, which requires little space on the semiconductor memory, can be used in order to implement it.

In one refinement, the second electrical potential depends linearly on the temperature in each of two mutually adjacent temperature ranges. Here, instead of more complex dependencies which would require an elaborate nonlinear subcircuit in order to implement them, two linear dependencies of the second potential on the measured temperature are implemented. Sufficient leakage-current minimization can be achieved cost-effectively with the aid of linear potential profiles in mutually adjacent temperature ranges.

Preferably, the second electrical potential changes linearly with the temperature more slowly in a lower temperature range than in a higher temperature range adjacent to it. This preferred embodiment takes into account, on the one hand, the subliminal current which occurs between the source and the drain of the selection transistor and, on the other hand, the GIDL effect by which charge carriers flow away from the storage capacitor to the substrate. Since the subliminal current does not become a dominant leakage-current mechanism until higher temperatures, a larger change of the second potential (the wordline potential) is carried out in the higher temperature range than in the lower temperature range. The subliminal current is restricted more effectively by a very large potential difference between the first and second potentials in the case of higher temperatures, so that the potential change is arranged to be comparatively large in the upper temperature range.

Preferably, the semiconductor memory controls the value of the second electrical potential with the aid of a temperature sensor internal to the memory. A temperature sensor internal to the memory is preferably integrated in the peripheral region of the semiconductor memory. The temperature sensor is connected to a subcircuit for adjusting the second potential, or is integrated into this subcircuit.

As an alternative, the semiconductor memory controls the value of the second electrical potential with the aid of an external temperature sensor.

Preferably, the transistor is a field-effect transistor and the electrode is a gate electrode, and the first and second electrical potentials are wordline potentials. The gate electrode in a field-effect transistor, which is part of the wordline, is separated from the semiconductor substrate, including the source and drain electrodes, by a gate-oxide layer or a gate dielectric, and it is insulated but does control the leakage-current mechanisms in the substrate through induced charge displacements.

Preferably, the transistor is an n-channel field-effect transistor in which the first potential is positive with respect to a substrate potential and in which the second potential decreases as the temperature increases. In particular, the second potential is less than the substrate potential.

As an alternative to this, the transistor may be a p-channel field-effect transistor in which the first potential is negative with respect to a substrate potential and in which the second potential increases as the temperature increases. In this case, the second potential is preferably greater than the substrate potential.

In CMOS circuits where both n-channel and p-channel transistors may in principle be used in the same semiconductor memory, two alternative types of embodiment could even be implemented simultaneously.

Preferably, the charge storages of the storage cells are storage capacitors, in particular trench capacitors. The inventive temperature-dependent modification of one electrode potential of the storage cell, however, may also be applied to other versions of storage cells.

The semiconductor memory is preferably a dynamic memory, in particular a dynamic read/write memory.

Embodiments of the invention also relate to a method for operating a semiconductor memory with a multiplicity of storage cells, each of which has a charge storage and a transistor with an electrode that is separated from a channel region of the transistor by a dielectric layer. The electrode is electrically biased selectively with a first electrical potential in order to open the transistor and with a second electrical potential in order to close the transistor. The second electrical potential is a temperature-dependent potential, which is controlled so that the second electrical potential becomes more different from the first electrical potential as the temperature increases.

The temperature-dependent regulation of the second electrical potential may be carried out automatically by the semiconductor memory, and it may be structurally integrated into the semiconductor memory via a subcircuit with a temperature sensor internal to the circuit. The temperature-dependent regulation of the second electrical potential, however, may alternatively or additionally be carried out with the aid of an external temperature measurement outside or in the vicinity of the semiconductor memory.

Preferably, the actual value of the second potential of the electrode may nevertheless be regulated by the semiconductor memory itself. The second electrical potential may, for example, be modified by from about 0.5 to about 5.0 mV/° C., preferably by from about 1.5 to about 2.5 mV/° C. The second electrical potential may, in particular, be modified linearly with the temperature. The second electrical potential may also be linearly modified more slowly with the temperature in a lower temperature range than in a higher temperature range adjacent to it.

In particular, a semiconductor memory, according to one of the embodiments described above, may be modern operated in this way.

BRIEF DESCRIPTION OF THE DRAWINGS

The invention will now be described with reference to the figures, in which:

FIG. 7 shows a mathematical approximation for the subliminal current;

FIG. 8 shows a mathematical definition of the subliminal current range; and

FIG. 9 shows an empirical approximation for the temperature-temperature dependency of retention times.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
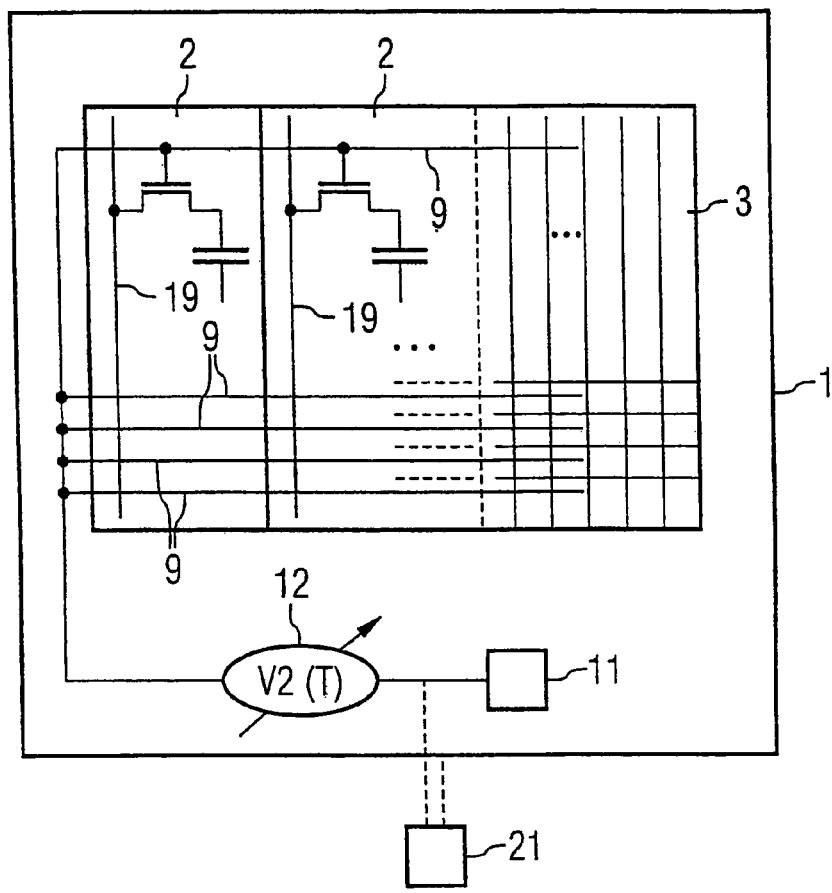
FIG. 1 shows a schematic representation of the semiconductor memory according to the invention.

FIG. 1 shows a semiconductor memory 1 with a storage cell array 3, which has a multiplicity of storage cells 2 each with a selection transistor 4 and a storage capacitor 5. The selection transistor will be described in detail below with reference to FIG. 2, such a selection transistor 4 being present in each storage cell in FIG. 1 and respectively connected to one wordline 9 and one bitline 19; the wordline or gate potential is dictated by the wordline 9. According to the invention, the semiconductor memory 1 has a temperature sensor 11, which measures the temperature of the semiconductor memory or its environment and delivers a signal dependent on this measurement, for example a particular current or a particular voltage, to a subcircuit 12 (for example a voltage controller) by which the second electrical potential V2 specific to the off state of the selection transistor 4 is regulated and delivered to the wordlines.

A line leading to an external temperature sensor 21, which can be used for the temperature measurement instead of the temperature sensor 11 internal to the chip, is represented by dashes in FIG. 1. In both cases, however, the regulation (control or regulating) of the second potential for the gate electrodes is preferably carried out with the aid of the subcircuit 12 internal to the chip.

Figure 2:
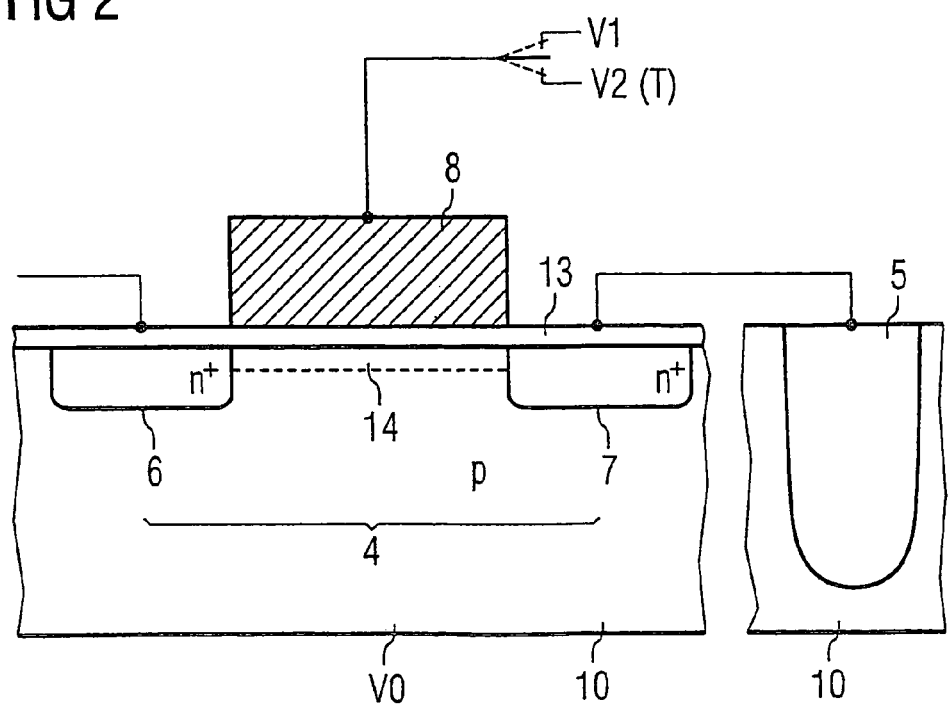
FIG. 2 shows a schematic representation of a storage cell with applied electrode potentials.

FIG. 2 shows a schematic cross-section through a storage cell, which, in various regions of a substrate 10, has a transistor 4 and a storage capacitor 5, preferably a trench capacitor. These source electrode 6 of the transistor is biased with a bitline potential. The drain electrode 7 is short-circuited with the inner electrode of the storage capacitor 5. The gate electrode 8 may be biased either to a first electrical potential V1, at which the transistor 4 forms a channel in the channel region 14 between the source 6 and the drain 7, or with a second electrical potential V2 at which channel formation in the region 14 is suppressed. According to the invention, the potential V2 intended for the off state of the transistor 4 is temperature-dependent, that is to say it is a function of the measured temperature T. In the case of an n-channel transistor 4 in a p-type well or a p-type substrate, the potential V1 for the transistor when it is open is higher than that of the substrate 10, that is to say the substrate potential V0. The wordline potential V2 is conventionally set to a lower value than the substrate potential V0, which is intended to reduce leakage currents by the value that has been set for it. According to an embodiment of the invention, the second electrical potential V2 is controlled so that it becomes more different from the first electrical potential V1 as the temperature T increases.

Figure 3:
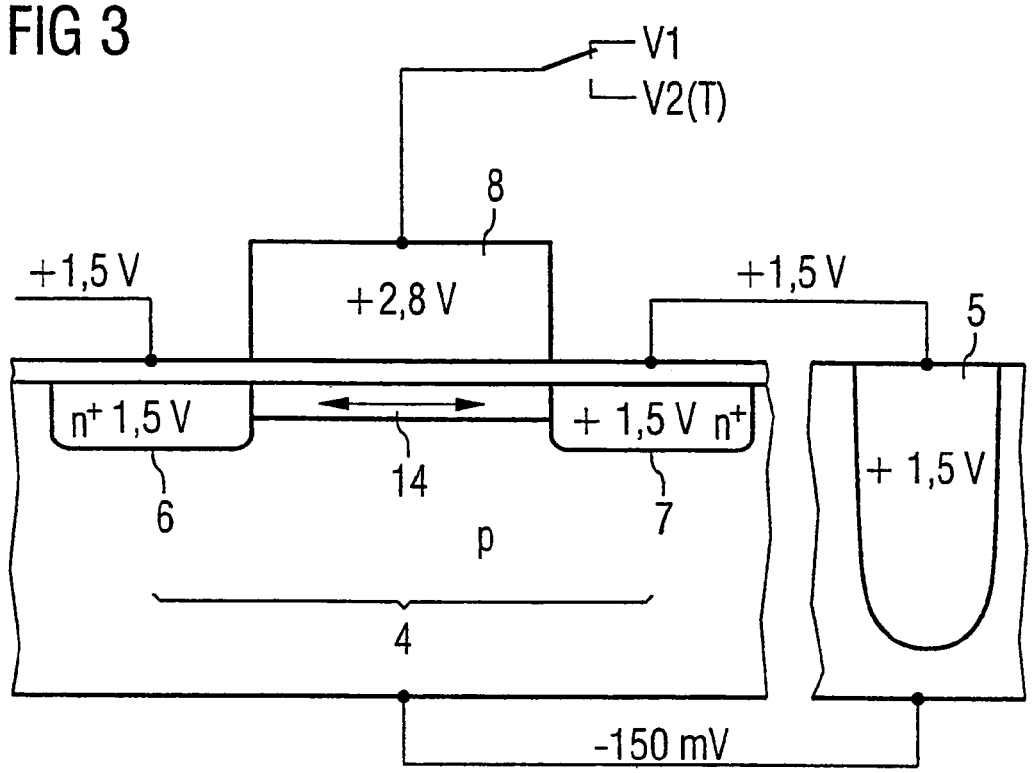
FIG. 3 shows a storage cell with a selection transistor in the on state.

FIG. 3 shows the potential conditions with reference to the example of an n-channel transistor 4 when it is open. In order to write a digital "1" to the storage capacitor 5, for example, a bitline potential of +1.5 V is applied to the source electrode 6. A wordline potential higher than this, namely +2.8 V, as the first gate electrode potential V1 ensures that a channel is formed in the channel region 14 and therefore that the potentials of the drain electrode 7 and of the storage capacitor 5 are raised to the bitline potential of +1.5 V.

Figure 4:
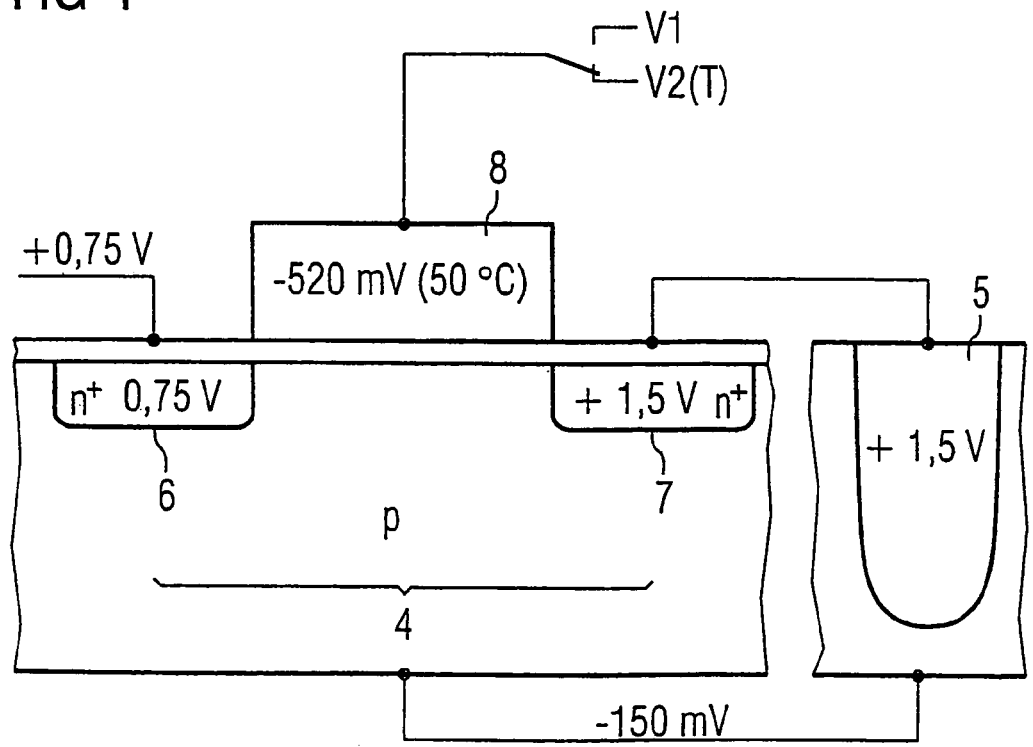
FIG. 4 shows a storage cell with a selection transistor in the off state.

FIG. 4 shows the transistor after such a storage process, when the off state potential V2 of −520 mV has been applied to the gate electrode so that the formation of a channel is suppressed. The source electrode 6 (on the bitline side) is biased to a value of 0.75 V which is not assigned to any unequivocal digital information "0" or "1". In the storage capacitor 5 and in the vicinity of the drain electrode 7, any digital information due to the quantity of charge accumulated at the potential of +1.5 V initially remains stored. The substrate potential is −150 mV as in FIG. 3.

The quantity of charge stored in the storage capacitor 5 in FIG. 4 gradually flows away because of subliminal currents and because of the GIDL effect. It is necessary to refresh the quantity of charge at regular time intervals, for example 64 ms. In order to reduce the leakage currents more expediently than is conventionally possible, according to an embodiment of the invention, the gate electrode 8 is biased with a temperature-dependent (second) potential V2.

Figure 5:
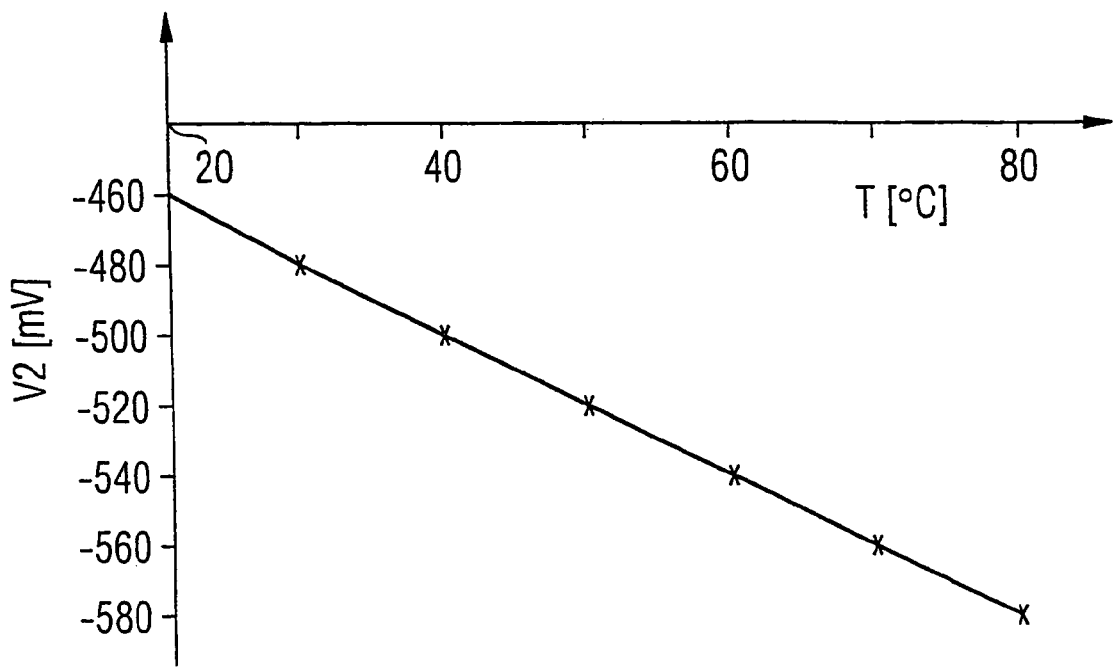
FIG. 5 shows a first embodiment of an inventive temperature-dependent regulation of the second electrode potential.

FIG. 5 shows a first embodiment of the temperature dependency intended for the potential V2 according to the invention, by way of example. According to FIG. 5, which is based on an n-channel transistor, the potential V2 is negative compared with the substrate voltage of −150 mV, for example, and therefore constitutes a counter voltage that counteracts the leakage currents. In the plotted temperature range of from 20 to 80° C. for example, an average value of −520 mV at 50° C. is taken as the setpoint operating temperature. The embodiment of FIG. 5 provides for a linear dependency of the second electrical potential V2 on the temperature, the potential V2 decreasing as the temperature increases. The linear dependency has the advantage that it can be implemented by a linear subcircuit in a way, which is straightforward and compact in terms of circuit technology. The reduction of the potential V2 from −460 mV at room temperature to −580 mV at 80° C. counteracts the growth of leakage currents, which occurs when the temperature increases. All the numerical values represented in FIG. 5 are merely examples. In practice, they will depend on the type of semiconductor memory, its design, the structure size and on technological parameters.

Figure 6:
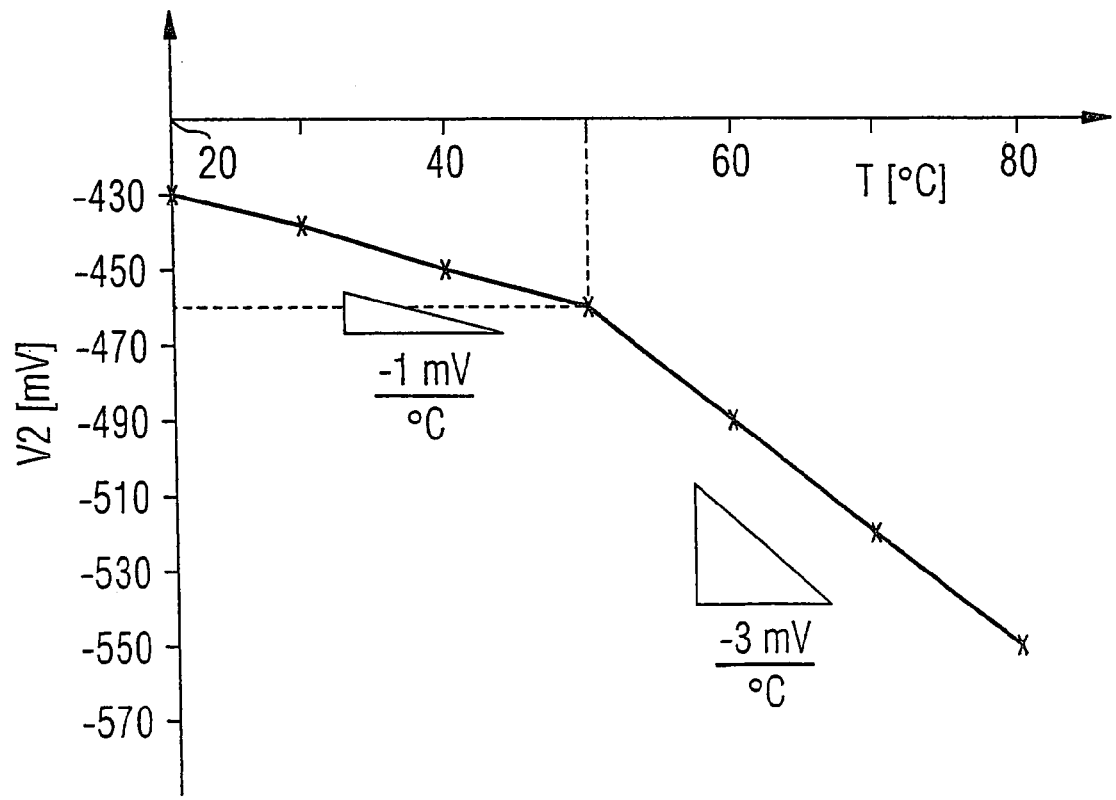

FIG. 6 shows another embodiment of the invention, in which a more complex dependency of the gate potential V2 on the temperature is approximated by two linear potential profiles. A relatively slow reduction of the potential V2 by −1 mV/° C. is provided in a first, lower temperature range I, so that the potential of −430 mV at room temperature is reduced to −460 mV at 50° C. Subliminal currents, which constitute the main leakage-current factor in this temperature range, are therefore reduced more effectively than with a fixed temperature-dependent potential V2 as is conventional. A stronger reduction of the potential V2 by −3 mV/° C. is provided in an adjacent upper temperature range II, so that the potential V2 is −550 mV at 80° C. The stronger modification of the potential V2 at higher temperatures takes account of the fact that tunnel currents due to the subliminal current constitute the majority of the leakage currents in this temperature range and would in fact be strengthened by an excessively negative gate potential (in the case of an n-channel transistor). The temperature change selected in the temperature range II is therefore arrived at by taking into account two leakage-current mechanisms which are in conflict at these temperatures. The potential profile of FIG. 6, the numerical values of which are likewise merely examples, is also much more compact and cost-effective to implement in terms of circuit technology than a nonlinear dependency over the full temperature range I and II, which would require nonlinear control circuits.

FIG. 7 represents a mathematical approximation for the subliminal current $I_{DS}$, which is obtained in the weakly inverted state of the transistor from the temperature T, the threshold voltage $U_{TN}$, the gate voltage $U_{GS}$, which corresponds to the potential V2 relative to the bitline potential, and from the source-drain voltage $U_{DS}$ and a material-dependent quantity n as well as the quantity $\ominus_n$, which depends on the transistor geometry. Boltzmann's constant is denoted by k and the elementary charge is denoted by q.

FIG. 8 mathematically defines the subliminal current range in which the gate voltage $U_{GS}$ is less than the sum of the threshold voltage $U_{TN}$ and a term linearly dependent on the temperature T. In this subliminal current range, with a drain-source voltage $U_{DS}$ above 100 mV, which is always exceeded in the case of a bitline potential set to a precharge level of for example +0.75 V, the square-bracketed term in FIG. 7 can be equated to the value 1; the remaining part of the equation in FIG. 7 gives a subliminal threshold which increases strongly with temperature owing to the quadratic temperature dependency, and which causes discharge of the capacitor 5 through the bitline. According to the invention, the growing subliminal current is compensated for by an increase in the difference that occurs in the exponent between the gate voltage $U_{GS}$, that is to say the second potential V2, and the threshold voltage $U_{TN}$. In the case of an n-channel transistor, the potential V2 decreases as the temperature increases. The potential shift is typically a few mV/° C. A weaker reduction of the potential V2 may be provided in a higher temperature range II, in order to stop direct band-to-band tunneling effect between the drain electrode 7 and the substrate 10 due to the GIDL.

FIG. 9 shows empirical approximation for the ratio of two retention times t at different temperatures T1, T2 by way of example. Halving of the retention time is generally observed for each temperature rise of 18° C. The quantity of charge in the storage capacitor can be stored for a longer time with the aid of the inventive temperature-dependent regulation of the wordline potential of the blocking transistor. It is possible to select longer retention times, which reduce the power consumption of the semiconductor memory.

Although the present invention and its advantages have been described in detail, it should be understood that various changes, substitutions and alterations can be made herein without departing from the spirit and scope of the invention as defined by the appended claims.

What is claimed is:

1. A semiconductor memory with a multiplicity of storage cells, each storage cell having a charge storage and a transistor with an electrode;
   the electrode being separated from a channel region of the transistor by a dielectric layer;
   the electrode being electrically biasable with a first electrical potential in order to open the transistor and with a second electrical potential in order to close the transistor;
   the semiconductor memory providing the first electrical potential and the second electrical potential;
   the second electrical potential provided by the semiconductor memory being a temperature-dependent potential, the value of which is controlled by the semiconductor memory in order to reduce leakage currents; and
   the second electrical potential being controlled so that it becomes more different from the first electrical potential as the temperature increases.

2. The semiconductor memory according to claim 1, wherein the second electrical potential varies by 0.5 to 5.0 mV/° C.

3. The semiconductor memory according to claim 1, wherein the second electrical potential varies by 1.5 to 2.5 mV/° C.

4. The semiconductor memory according to claim 1, wherein the second electrical potential depends linearly on the temperature.

5. The semiconductor memory according to claim 1, wherein the second electrical potential depends linearly on the temperature in each of two mutually adjacent temperature ranges.

6. The semiconductor memory according to claim 5, wherein the second electrical potential changes linearly with the temperature more slowly in a lower temperature range than in an higher temperature range adjacent to it.

7. The semiconductor memory according to claim 1, wherein the semiconductor memory controls the value of the second electrical potential with the aid of a temperature sensor internal to the memory.

8. The semiconductor memory according to claim 1, where the semiconductor memory controls the value of the second electrical potential with the aid of an external temperature sensor.

9. The semiconductor memory according to claim 1, wherein the transistor is a field-effect transistor and the electrode is a gate electrode, and in that the first and second electrical potentials are wordline potentials.

10. The semiconductor memory according to claim 9, wherein the transistor is an n-channel field-effect transistor in which the first potential is positive with respect to a substrate potential and in which the second potential decreases as the temperature increases.

11. The semiconductor memory according to claim 10, wherein the second potential is less than the substrate potential.

12. The semiconductor memory according to claim 1, wherein the charge storage comprises a storage capacitor.

13. The semiconductor memory according to claim 12, wherein the storage capacitor comprises a trench capacitor.

14. The semiconductor memory according to claim 1, wherein the semiconductor memory comprises a dynamic read/write memory.

15. A method for operating a semiconductor memory with a multiplicity of storage cells, each storage cell having a charge storage and a transistor with an electrode that is separated from a channel region of the transistor by a dielectric layer, the method comprising:
   electrically biasing the electrode with a first electrical potential in order to open the transistor; and
   electrically biasing the electrode with a second electrical potential in order to close the transistor;
      wherein the second electrical potential is a temperature-dependent potential, which is controlled so that the difference between the second electrical potential and the first electrical potential increases as the temperature increases.

16. The method according to claim 15, wherein the value of the second electrical potential is controlled by the semiconductor memory.

17. The method according to claim 15, wherein the second electrical potential varies at a rate of 0.5 to 5.0 mV/° C.

18. The method according to claim 17 wherein the second electrical potential varies at a rate of 1.5 to 2.5 mV/° C.

19. The method according to claim 15, wherein the second electrical potential is modified linearly with the temperature.

20. The method according to claim 15, wherein the second electrical potential is linearly modified more slowly with the temperature in a lower temperature range than in an higher temperature range adjacent to it.

21. A semiconductor device comprising:
   a semiconductor substrate;
   an array of dynamic random access memory cells disposed in the semiconductor substrate, each memory cell comprising a storage capacitor coupled in series with an access transistor, the access transistor having a gate electrode coupled to a wordline;
   a temperature sensor disposed in the semiconductor substrate; and
   a voltage regulator coupled between the wordline and temperature sensor, the voltage regulator applying a voltage to the gate electrode to turn off the access transistor, the voltage being a function of a temperature measured by the temperature sensor.

22. The semiconductor memory of claim 21, wherein the voltage is a linear function of temperature.

23. The semiconductor memory of claim 22, wherein the voltage varies by between 1.5 and 2.5 mV/° C.

24. The semiconductor memory of claim 22, wherein the voltage depends linearly on the temperature.

25. The semiconductor memory of claim 24, wherein the voltage depends linearly on the temperature in each of two mutually adjacent temperature ranges.

* * * * *